(12) United States Patent
Qi et al.

(10) Patent No.: US 9,887,094 B1
(45) Date of Patent: Feb. 6, 2018

(54) METHODS OF FORMING EPI SEMICONDUCTOR MATERIAL ON THE SOURCE/DRAIN REGIONS OF A FINFET DEVICE

(71) Applicant: GLOBALFOUNDRIES Inc., Grand Cayman (KY)

(72) Inventors: Yi Qi, Niskayuna, NY (US); Hsien-Ching Lo, Clifton Park, NY (US); Jianwei Peng, Latham, NY (US); Yanping Shen, Saratoga Springs, NY (US); Hui Zhan, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/585,800

(22) Filed: May 3, 2017

(51) Int. Cl.
*H01L 21/3105* (2006.01)
*H01L 29/66* (2006.01)
*H01L 29/08* (2006.01)
*H01L 21/311* (2006.01)

(52) U.S. Cl.
CPC .. *H01L 21/31053* (2013.01); *H01L 21/31111* (2013.01); *H01L 29/0847* (2013.01); *H01L 29/6656* (2013.01); *H01L 29/66545* (2013.01); *H01L 29/66795* (2013.01)

(58) Field of Classification Search
None
See application file for complete search history.

(56) References Cited

U.S. PATENT DOCUMENTS 9,123,744 B1 * 9/2015 Liao ................... H01L 21/0262
9,159,630 B1 * 10/2015 Wei ..................... H01L 27/0924

* cited by examiner

*Primary Examiner* — Angel Roman
*Assistant Examiner* — Kevin Quinto
(74) *Attorney, Agent, or Firm* — Amerson Law Firm, PLLC

(57) ABSTRACT

One illustrative method disclosed includes, among other things, forming a fin spacer adjacent a lower portion of a fin that is comprised of a fin spacer material, forming a conformal layer of a second spacer material on the exposed sidewalls and the upper surface of the fin, on the fin spacer and adjacent a gate structure of the FinFET device, wherein the second spacer material is a different material than the fin spacer material, performing an etching process to remove the second conformal layer from above the fin spacer to thereby re-expose the sidewalls of the fin above the fin spacer and the upper surface of the fin while forming a gate spacer comprising the second spacer material adjacent the gate structure, and forming an epi semiconductor material on the exposed sidewalls and upper surface of the fins above the first fin spacer.

12 Claims, 14 Drawing Sheets

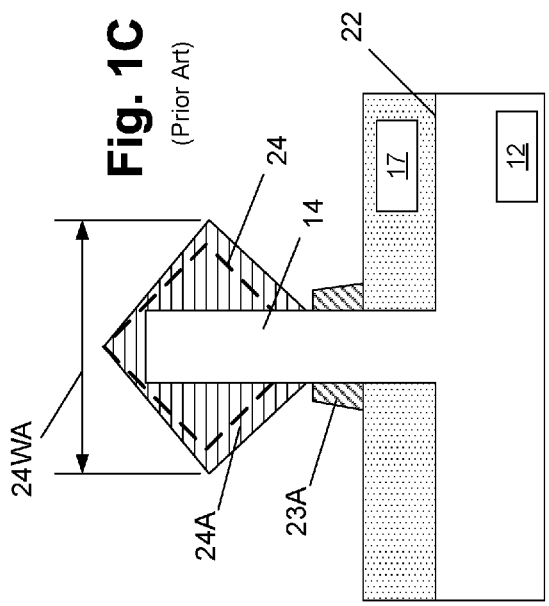
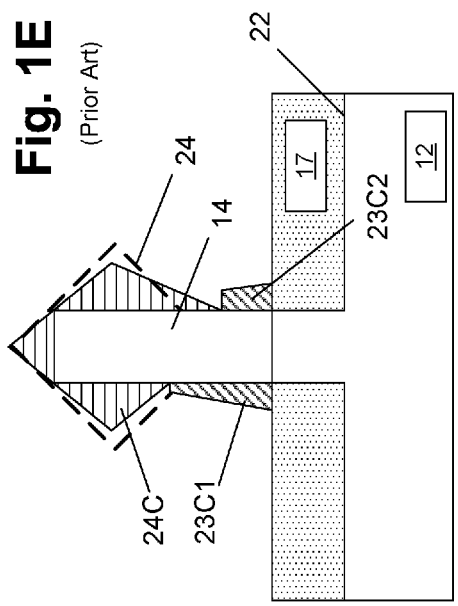
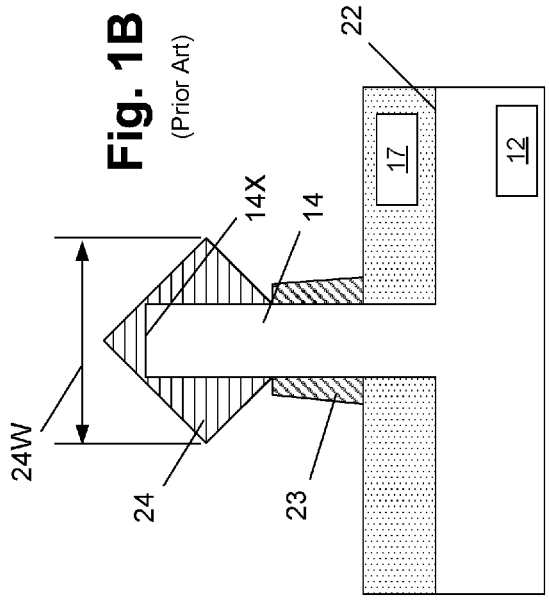
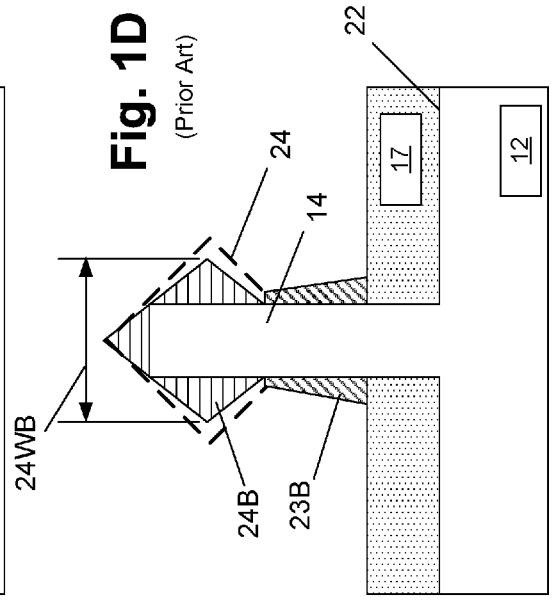

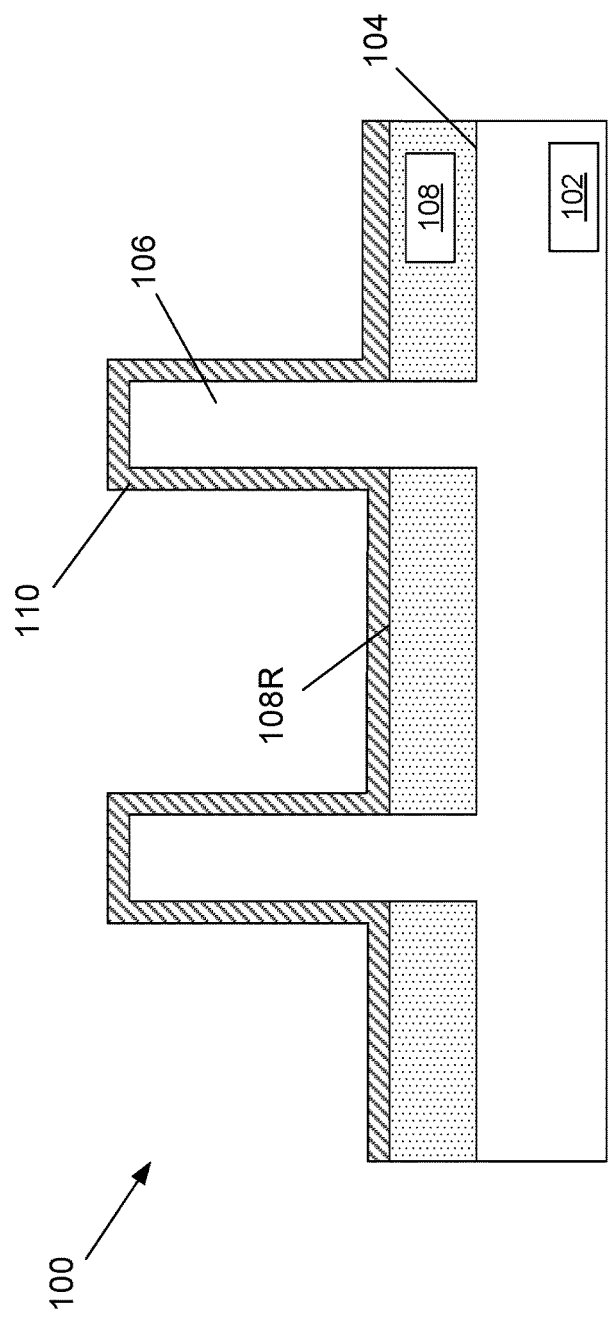

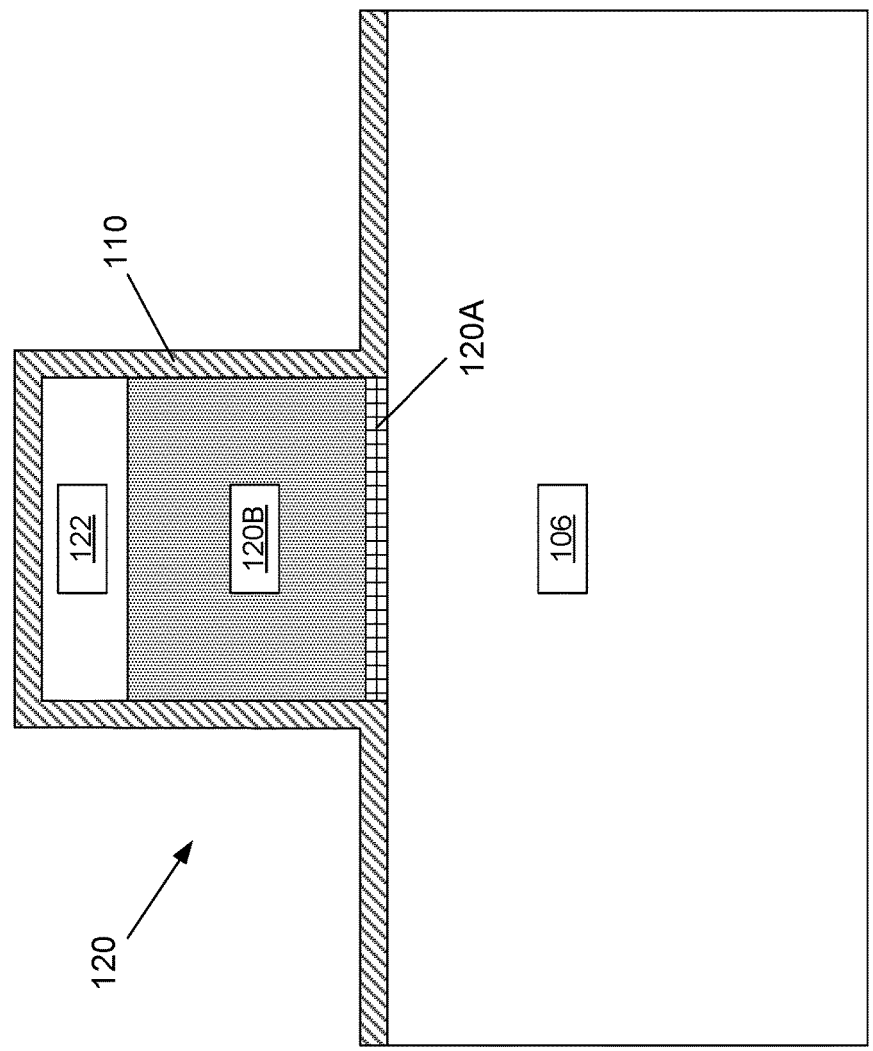

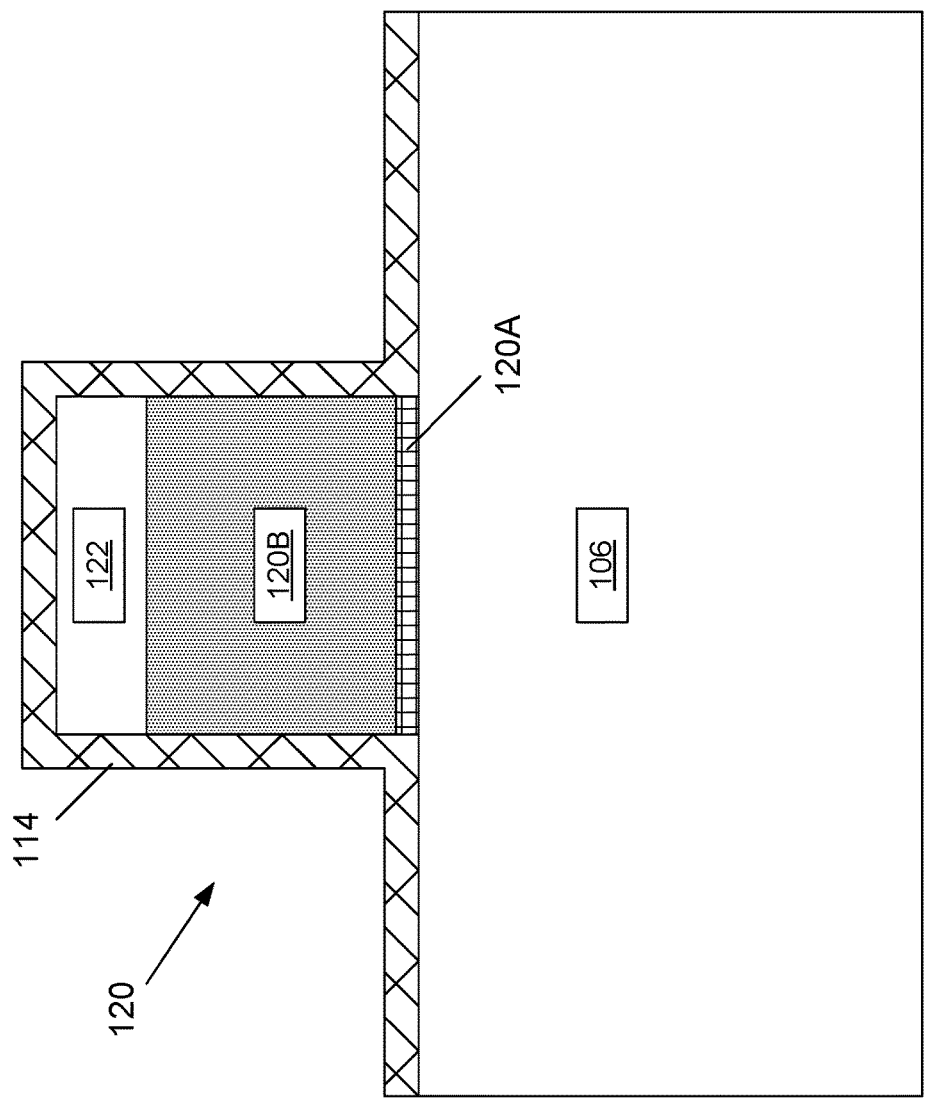

METHODS OF FORMING EPI SEMICONDUCTOR MATERIAL ON THE SOURCE/DRAIN REGIONS OF A FINFET DEVICE

BACKGROUND OF THE INVENTION

1. Field of the Invention

The present disclosure generally relates to the fabrication of integrated circuits, and, more particularly, to methods of forming epi semiconductor material on the source/drain regions of a FinFET device.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

In contrast to a planar FET, which, as the name implies, is a generally planar structure, a so-called FinFET device has a three-dimensional (3D) structure. FIG. 1A is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes three illustrative fins 14, a gate structure 16, a sidewall spacer 18 and a gate cap 20. Fin-formation trenches 22 are formed in the substrate 12 to define the fins 14. A recessed layer of insulating material 17 is positioned under the gate structure 16 and between the fins 14 in the areas outside of the gate structure, i.e., in the source/drain regions of the device 10. The gate structure 16 is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device 10. The fins 14 have a three-dimensional configuration: a height H, a width W and an axial length L. The axial length L corresponds to the direction of current travel in the device 10 when it is operational, i.e., the gate length direction of the device. The portions of the fins 14 covered by the gate structure 16 are the channel regions of the FinFET device 10. The gate structures 16 for such FinFET devices 10 may be manufactured using so-called "gate-first" or "replacement gate" (gate-last) manufacturing techniques. A FinFET device may have either a tri-gate or dual-gate channel region. For a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior FET structure as compared to that of a planar FET, especially in the 20 nm CMOS technology node and beyond.

To improve the operating speed of FETs, and to increase the density of FETs on an integrated circuit device, device designers have greatly reduced the physical size of FETs over the years, particularly the channel length of transistor devices. As it relates to FinFET devices, advanced technology nodes require that the fins 14 be formed with an ever decreasing fin pitch 15 (see FIG. 1A). With reference to FIG. 1B, at some point during the process of manufacturing the device 10, epi semiconductor 24 will be grown on the exposed portions of the fin 14 above a fin spacer 23 (not shown in FIG. 1A). Typically, due to the crystallographic orientation of the material of the fins 14, the epi material 24 will grow in a somewhat diamond-shaped configuration. The epi growth process is a self-limiting process in that there is only a certain amount of epi material 24 that will grow above the upper surface 14X of the fins 14. This is sometimes referred to as "fin top pinning." Ideally, the epi semiconductor material 24 on all of the fins 14 across the substrate 12 will be substantially uniform in volume and in size. FIG. 1B depicts an idealized region of epi material 24 that has a desired target lateral width 24W and is substantially uniformly formed on the exposed portions of the fin 14. It is important to insure that the lateral width of any grown epi material is not larger than the target width as such a situation might lead to undesirable merger to epi material 24 on adjacent fins 14 which can result in electrical shorts and/or complete device failure. In advanced devices, device designers have begun forming a fin spacer 23 on the bottom portion of the fins 14 in an effort to limit the amount of the fin 14 that is exposed and thereby the overall size and width of the epi material 24. On the other hand, if the epi material is formed with less volume than that anticipated by the design process, the contact resistance of the device 10 will increase, thereby reducing device performance.

There are several possible variations as it relates to the formation of such fin spacers 23 that may adversely impact the performance capabilities of FinFET devices. FIG. 1C depicts an example wherein a fin spacer 23A is formed to a lesser height than that of the idealized spacer 23 shown in FIG. 1B. As a result, the epi semiconductor material 24A formed in this situation is larger than the volume of epi material 24 formed on the device in FIG. 1B and it has a wider width 24WA than the idealized or target width 24W. The outline of the idealized or target epi semiconductor material 24 is depicted in a dashed line in FIG. 1C. Thus, in such a situation, there is a possibility of undesirable merging of epi material formed on adjacent fins.

FIG. 1D depicts an example wherein a fin spacer 23B is formed to a greater height than that of the idealized spacer 23 shown in FIG. 1B. As a result, the epi semiconductor material 24B formed in this situation is smaller than the volume of epi material 24 formed on the device in FIG. 1B and it has a smaller width 24WB than the idealized or target width 24W. As before, the outline of the idealized or target epi semiconductor material 24 is depicted in a dashed line in FIG. 1D. Thus, in such a situation, there is a lesser volume of epi material formed than is anticipated by the design process, which may undesirably increase the contact resistance for the device.

FIG. 1E depicts an example wherein the fin spacer 23C is asymmetrical in nature in terms of its size. More specifically, the fin spacer 23C comprises a first portion 23C1 on a first sidewall of the fin 14 that is taller than a second portion 23C2 on a second sidewall of the fin 14. As a result of the asymmetric configuration of the spacer 23C, the epi semiconductor material 24C has a non-standard configuration wherein unequal amounts of the epi material 24C are formed on opposite sides of the fin 14. Formation of such irregular shaped epi material can make contacting such irregular structures more problematic, which can lead to reduced product yields.

The present disclosure is directed to various methods of forming epi semiconductor material on the source/drain regions of a FinFET device and the resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming epi semiconductor material on the source/drain regions of a FinFET device and the resulting device. One illustrative method disclosed includes, among other things, forming a fin spacer adjacent a lower portion of a fin above a recessed layer of insulating material, the fin spacer comprising a fin spacer material, wherein sidewalls of the fin located above an upper surface of the fin spacer and the upper surface of the fin are exposed, and forming a conformal layer of a second spacer material on the exposed sidewalls and the upper surface of the fin and adjacent a gate structure of the FinFET device, wherein the second spacer material is a different material than the fin spacer material. In this example, the method also includes performing an etching process to remove the second conformal layer of the second spacer material from above the fin spacer and thereby re-expose the sidewalls of the fin located above an upper surface of the fin spacer and the upper surface of the fin and to form a gate spacer comprising the second spacer material adjacent the gate structure, and forming an epi semiconductor material on the exposed sidewalls and upper surface of the fin above the fin spacer.

Another illustrative method disclosed herein includes, among other things, forming a first conformal layer of a fin spacer material on a portion of a fin positioned above a recessed layer of insulating material, forming a recessed layer of a sacrificial material above the recessed layer of insulating material, the recessed layer of insulating material having a recessed upper surface that is positioned at a level that is below an upper surface of the fin, and performing a first etching process to remove a first portion of the first conformal layer of the fin spacer material located above the recessed upper surface of the recessed layer of a sacrificial material so as to thereby expose sidewalls and the upper surface of the fin while leaving a second portion of the first conformal layer of the fin spacer material positioned adjacent the sidewalls of the fin. In this example, the method also includes performing a second etching process to remove the recessed layer of a sacrificial material selectively relative to the second portion of the first conformal layer of the fin spacer material, forming a second conformal layer of a second spacer material on the exposed sidewalls and the upper surface of the fin, on the second portion of first conformal layer of the fin spacer material and adjacent a gate structure of the FinFET device, wherein the second spacer material is a different material than the fin spacer material, performing a third etching process to remove the second conformal layer of the second spacer material from above the second portion of first conformal layer of the fin spacer material, and forming an epi semiconductor material on the exposed sidewalls and upper surface of the fin above the second portion of the first conformal layer of the fin spacer material.

BRIEF DESCRIPTION OF THE DRAWINGS

The disclosure may be understood by reference to the following description taken in conjunction with the accompanying drawings, in which like reference numerals identify like elements, and in which:

FIGS. 1B-1E depicts the formation of epi semiconductor material in the source/drain regions of a FinFET device with various illustrative examples of variations in the size of the epi semiconductor material that is formed due to variations in the height of prior art spacers formed adjacent the sidewall of the fins in the source/drain regions; and FIGS. 2A-2L depict various methods disclosed herein for forming epi semiconductor material on the source/drain regions of a FinFET device and the resulting devices.

Figure 1A:
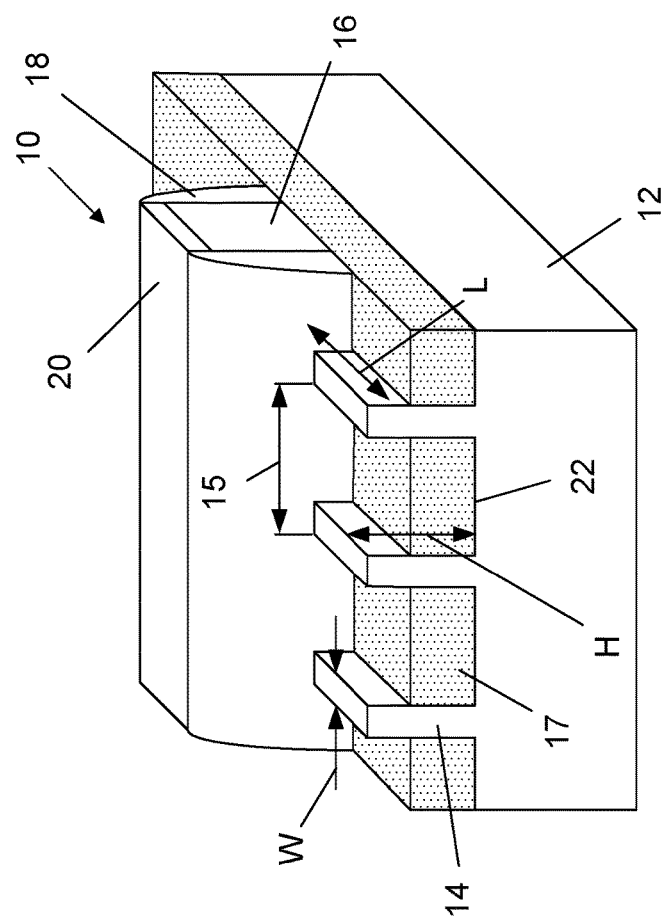
FIG. 1A is a simplistic depiction of an illustrative prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming epi semiconductor material on the source/drain region of a FinFET device and the resulting devices. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. The gate structures for such devices may be formed using either "gate first" or "replacement gate" manufacturing techniques. Thus, the presently disclosed inventions should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 2A-2L depict various methods disclosed herein for forming epi semiconductor material on the source/drain regions of a FinFET device and the resulting devices. Unless otherwise noted, FIGS. 2A-2L are cross-sectional views taken through the source/drain regions of the device (in a direction corresponding to the gate width direction of the device) at a location where a conductive source/drain contact structure (e.g., a trench silicide structure) will eventually be formed so as to establish a conductive path to the source/drain regions.

With reference to FIG. 2A, the illustrative product 100 will be formed in and above the semiconductor substrate 102. The product 100 may comprise either NMOS transistors, PMOS transistors or both types of transistors. Additionally, various doped regions, e.g., source/drain regions, halo implant regions, well regions and the like, are not depicted in the attached drawings. The substrate 102 may have a variety of configurations, such as the depicted bulk silicon configuration. The substrate 102 may also have a silicon-on-insulator (SOI) configuration (not shown) that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. The gate structures for the illustrative transistor devices disclosed herein may be formed using well-known "gate first" or "replacement gate" manufacturing techniques.

FIG. 2A depicts the product 100 after several process operations were performed. First, one or more etching processes, e.g., anisotropic etching processes, were performed through a patterned fin-formation etch mask (not shown) to form a plurality of fin-formation trenches 104 in the substrate 102 and thereby define a plurality of fin structures 106. The patterned fin-formation hard mask may be comprised of one or more layer of materials and it may be formed to any desired overall thickness, e.g., the patterned fin-formation hard mask may be comprised of a relatively thin layer of silicon dioxide and a relatively thicker layer of silicon nitride. The patterned fin-formation hard mask may be formed by depositing the layer or layers of material of the patterned fin-formation hard mask above the upper surface of the substrate 102 and thereafter patterning those layers of material using known photolithography and etching techniques.

With continuing reference to FIG. 2A, the width and height of the fin structures 106 may vary depending upon the particular application. Additionally, the overall size, shape and configuration of the fin-formation trenches 104 and fin structures 106 may vary depending on the particular application. In the illustrative examples depicted in the attached drawings, the fin-formation trenches 104 and the fins 106 are all depicted as having a uniform size and shape. However, such uniformity in the size and shape of the trenches 104 and the fins 106 is not required to practice at least some aspects of the inventions disclosed herein. In the attached figures, the fin-formation trenches 104 are depicted as having been formed by performing an anisotropic etching process that results in the fin structures 106 having a schematically (and simplistically) depicted, generally rectangular configuration. In an actual real-world device, the sidewalls of the fins 106 may be somewhat outwardly tapered (i.e., the fins may be wider at the bottom of the fin than they are at the top of the fin) although that configuration is not depicted in the attached drawings. Thus, the size and configuration of the trenches 104 and the fins 106, and the manner in which they are made, should not be considered a limitation of the present invention. For ease of disclosure, only the substantially rectangular trenches 104 and fins 106 will be depicted in the subsequent drawings. Moreover, the FinFET device may be formed with any desired number of fins 106. In the example depicted herein, the FinFET device will be depicted as being comprised of two of the illustrative fins 106 at this point in the process flow.

Still referencing FIG. 2A, a layer of insulating material 108 (e.g., silicon dioxide) was then deposited so as to overfill the fin-formation trenches 104 and, thereafter, at least one process operation, such as a chemical mechanical polishing (CMP) process, was performed to planarize the upper surface of the layer of insulating material 108 with the upper surface of fins 106, thereby removing the patterned fin-formation hard mask. Next, a recess etching process was performed on the layer of insulating material 108 such that it has a recessed upper surface 108R that exposes a desired amount of the fins 106 above the recessed upper surface 108R.

FIG. 2B is a cross-sectional view taken through one of the fins 106 in a direction corresponding to the gate length (current transport) direction of the device. As shown in FIG. 2B, after the layer of insulating material 108 was recessed, a gate structure 120 with a gate cap 122 was formed above the fins 106. The gate structure 120 may be a final gate structure (a gate-first manufacturing process) or it may be a sacrificial gate structure (for a replacement gate manufacturing process). The gate structure 120 may be comprised of a gate insulation layer 120A, e.g., silicon dioxide or a high-k material having a dielectric constant greater than 10, and a gate electrode 120B comprised of one or more layers of conductive material, e.g., metal-containing materials. The gate cap 122 may be comprised of a material such as, for example, silicon nitride.

With continuing reference to FIGS. 2A-2B, after the gate structure 120 was formed, a conformal layer of fin spacer material 110 for a fin spacer was formed across the entire product including adjacent the fins 106 and the previously formed gate structure 120 by performing a conformal deposition process, e.g., a conformal ALD or CVD process. The thickness of the conformal layer of fin spacer material 110 may vary depending upon the particular application (e.g., 2-10 nm) and it may be made of a variety of materials, e.g., silicon nitride, SiBCN, SiOCN, etc.

Figure 2C:
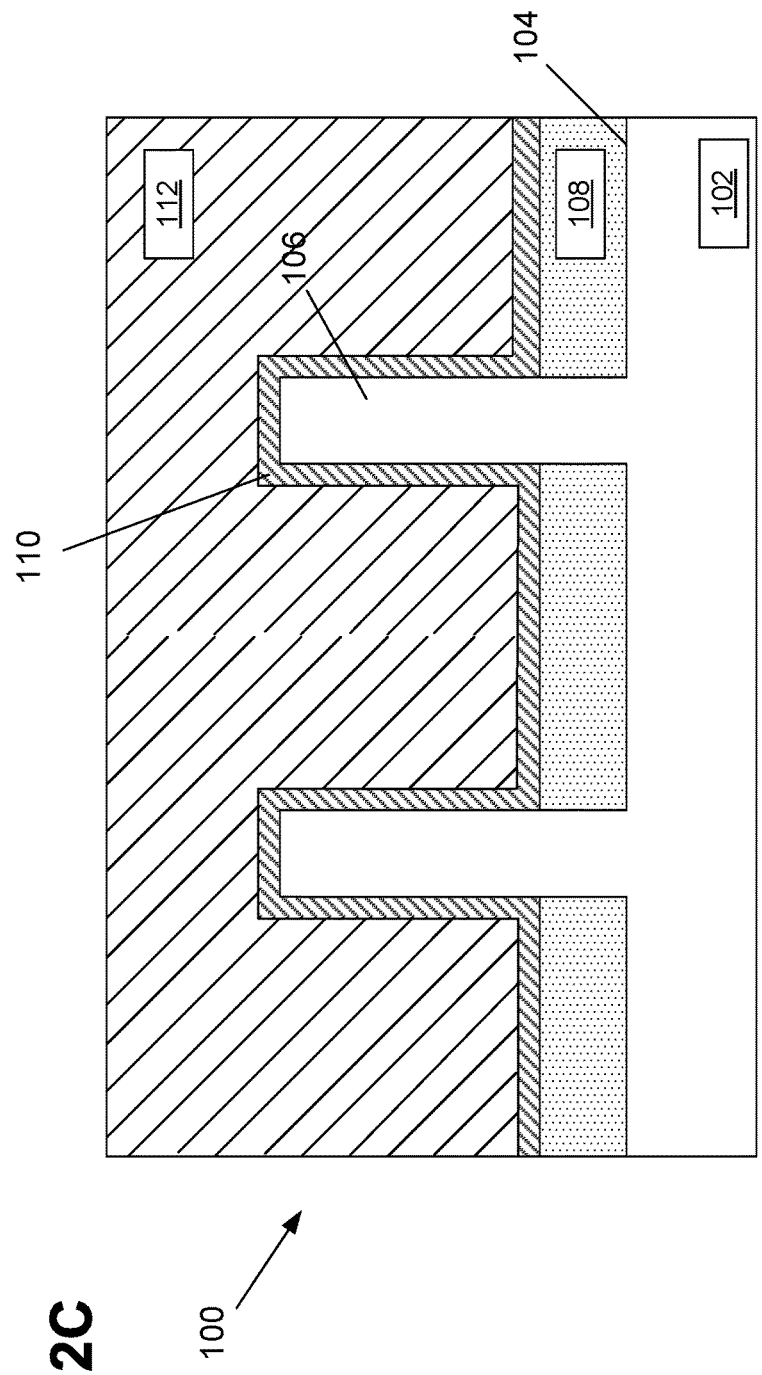

FIG. 2C depicts the product 100 after an illustrative sacrificial layer of material 112 was blanket-deposited above the product 100 and after a chemical mechanical planarization (CMP) process was performed to planarize the upper surface of the sacrificial layer of material 112. The sacrificial layer of material 112 may be comprised of a variety of materials, e.g., SOH, OPL, etc. The sacrificial layer of material 112 should be made of a material that may be selectively removed by etching relative to the material of the conformal layer of fin spacer material 110.

Figure 2D:
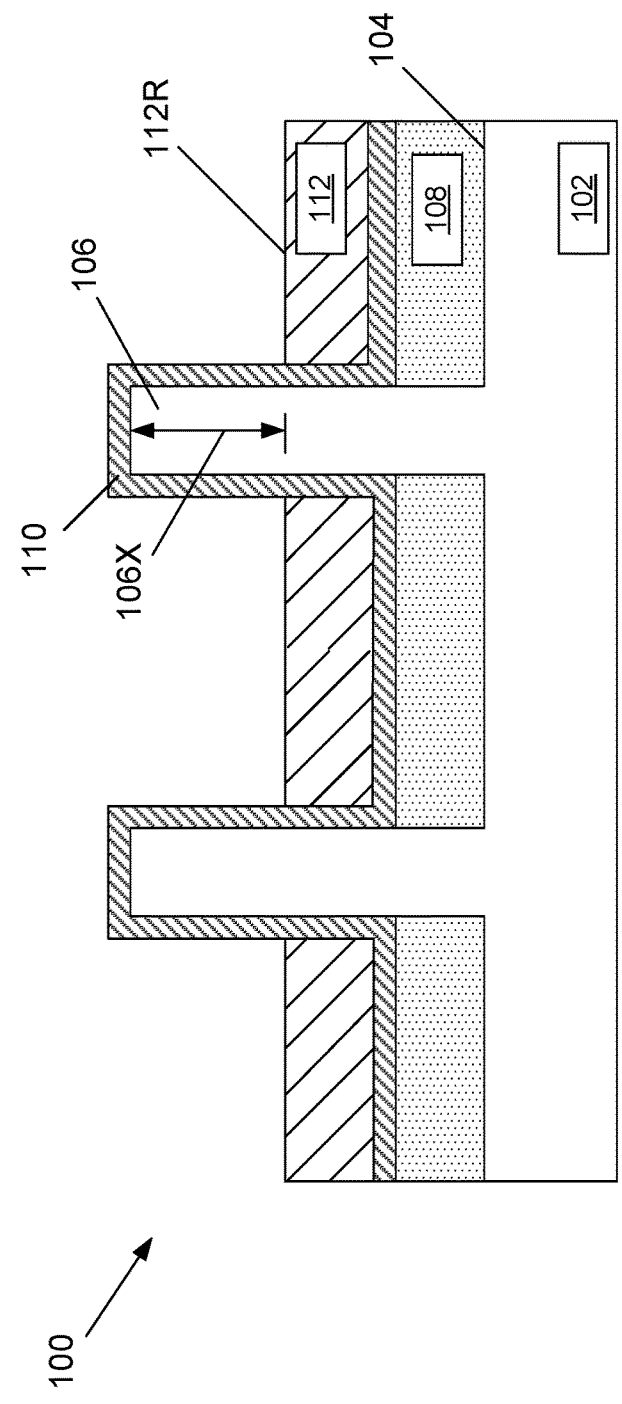

FIG. 2D depicts the product 100 after a recess etching process was performed on the sacrificial layer of material 112 such that it has a recessed upper surface 112R that is recessed to a desired level such that a desired amount 106X of the fins 106 is located at a level that is above the level of the recessed upper surface 112R. The sacrificial layer of material 112 may be recessed using any technique, e.g., a wet or dry etching process. Importantly, the recessing of the sacrificial layer of material 112 can be controlled such that the recessed upper surface 112R is positioned at substantially the same level in all of the fin-formation trenches 104. As shown more fully below, this will permit uniform exposure of the desired amount 106X of the fins 106 on all of the fins 106 formed on the substrate.

Figure 2E:
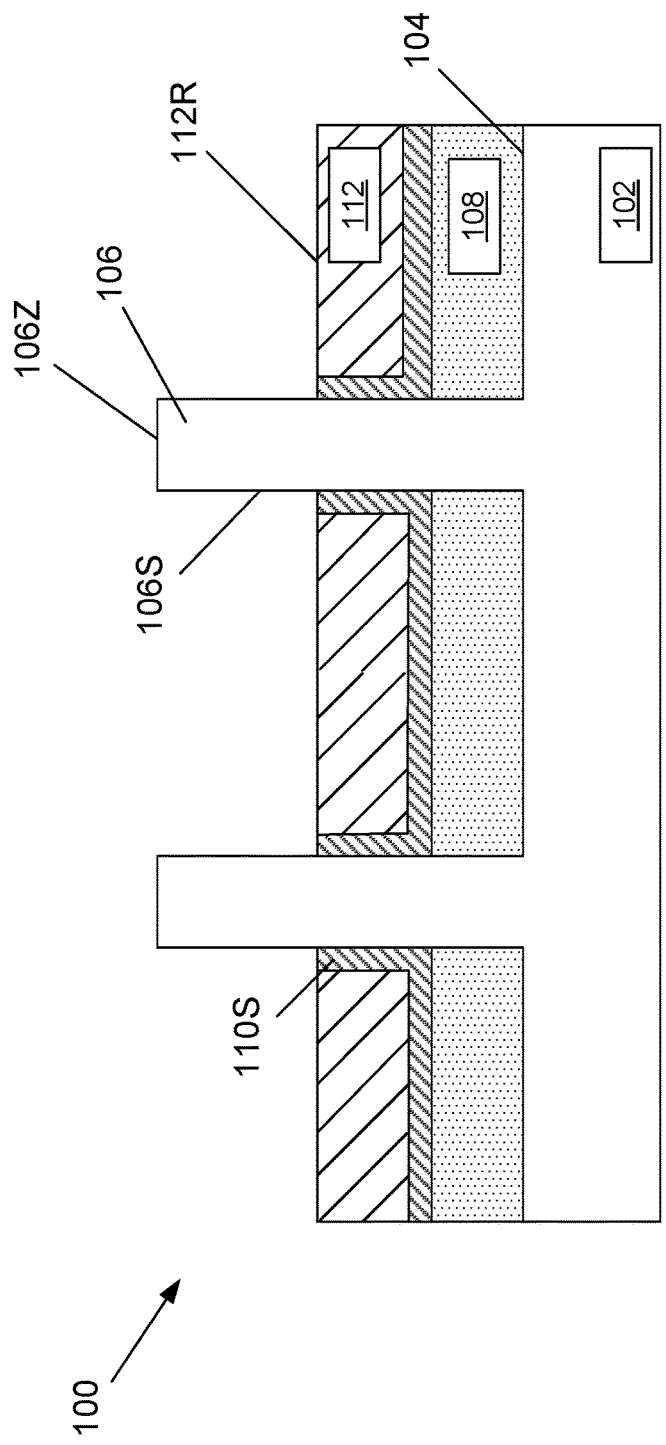
Figure 2F:
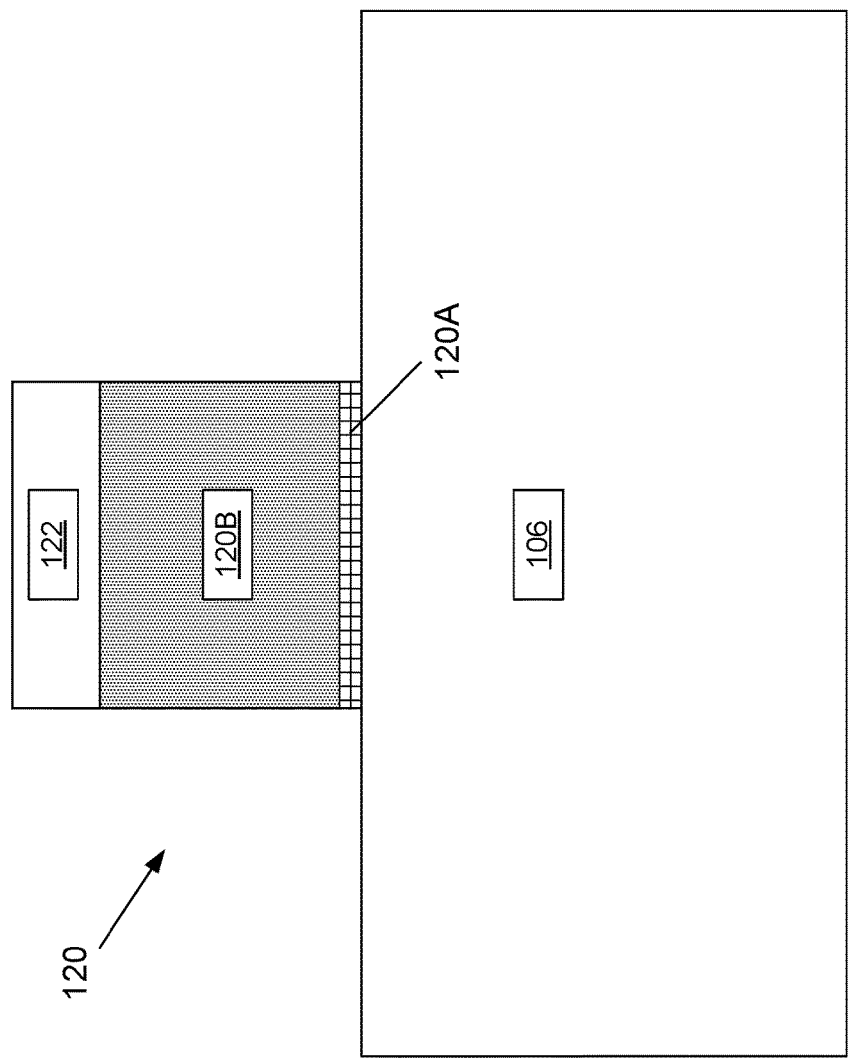

FIGS. 2E and 2F depict the product 100 after an etching process was performed to remove a first portion of the conformal layer of fin spacer material 110 positioned above the recessed upper surface 112R of the sacrificial layer of material 112 selectively relative to the surrounding materials. FIG. 2F is a cross-sectional view taken through one of the fins 106 in a direction corresponding to the gate length (current transport) direction of the device. This etching process also leaves a second portion 110S of the conformal layer of fin spacer material 110 that is positioned around and covers a lower portion of the fins 106. The portion of the second portion 110S positioned adjacent the fin 106 constitutes a fin spacer 110S. As depicted, this process operations clears the sidewalls 106S and the upper surface 106Z of the fins 106 above the recessed surface 112R of the conformal layer of fin spacer material 110 in the source/drain region of the device. This etching process also removes the portion of the conformal layer of fin spacer material 110 positioned adjacent the gate structure 120, as shown in FIG. 2F. In one illustrative embodiment, the etching process may be a timed wet etching process.

Figure 2G:
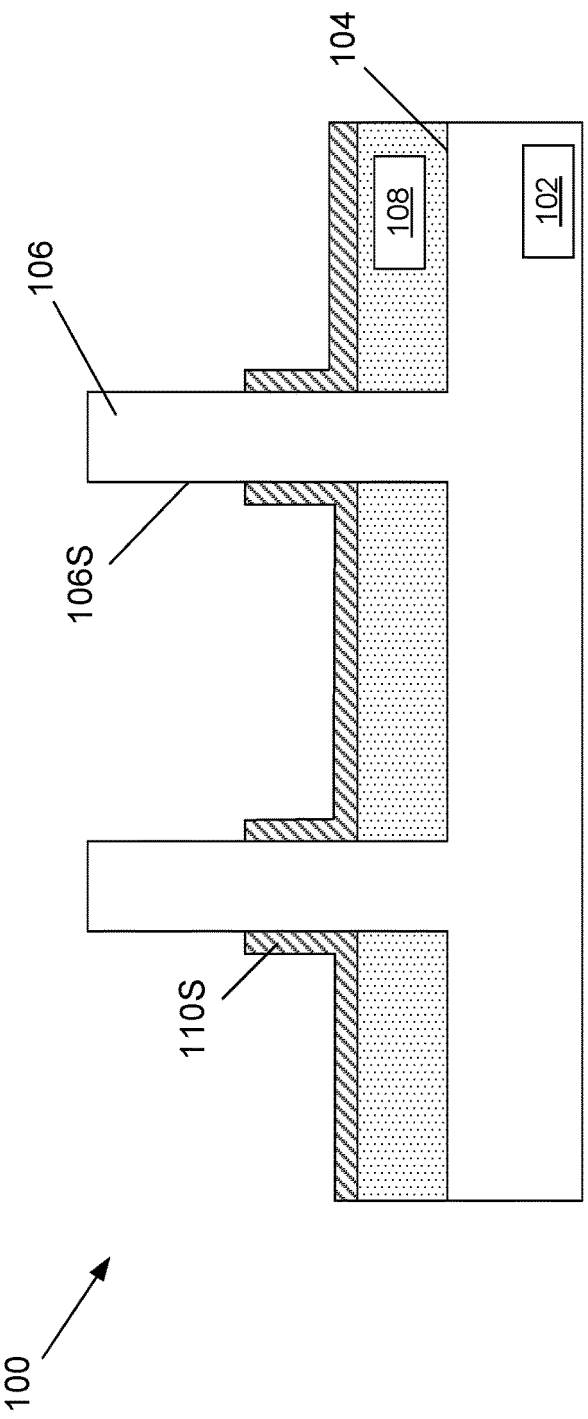

FIG. 2G depicts the product 100 after an etching process was performed to selectively remove the remaining portions of the sacrificial layer of material 112 relative to the surrounding materials and structures while leaving the first fin spacer 110S in position.

Figure 2H:
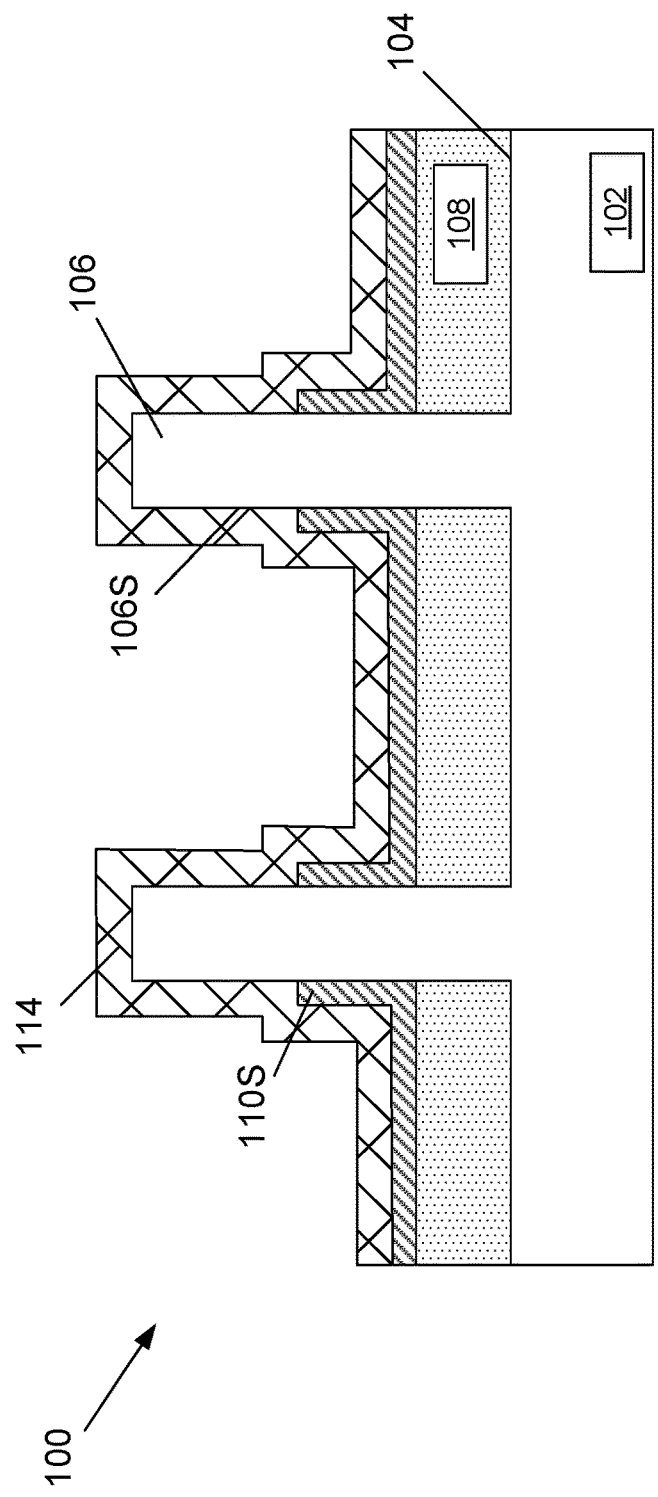

FIGS. 2H and 2I depict the product 100 after a conformal layer of spacer material 114 for a second spacer was formed across the entire product including above the fin spacer 110S, adjacent the fins 106, and adjacent the previously formed gate structure 120 by performing a conformal deposition process, e.g., a conformal ALD or CVD process. FIG. 2I is a cross-sectional view taken through one of the fins 106 in a direction corresponding to the gate length (current transport) direction of the device. The thickness of the conformal layer of spacer material 114 may vary depending upon the particular application (e.g., 5-20 nm) and it may be made of a variety of materials, e.g., a low-k material having a dielectric constant less than about 4.3, e.g., SiOCN, SiBCN, etc. In general, the conformal layer of spacer material 114 should be made of a material that exhibits good etch selectivity relative to the conformal layer of spacer material 110. That is, the second spacer material 114 is a different material than the fin spacer material 110.

Figure 2J:
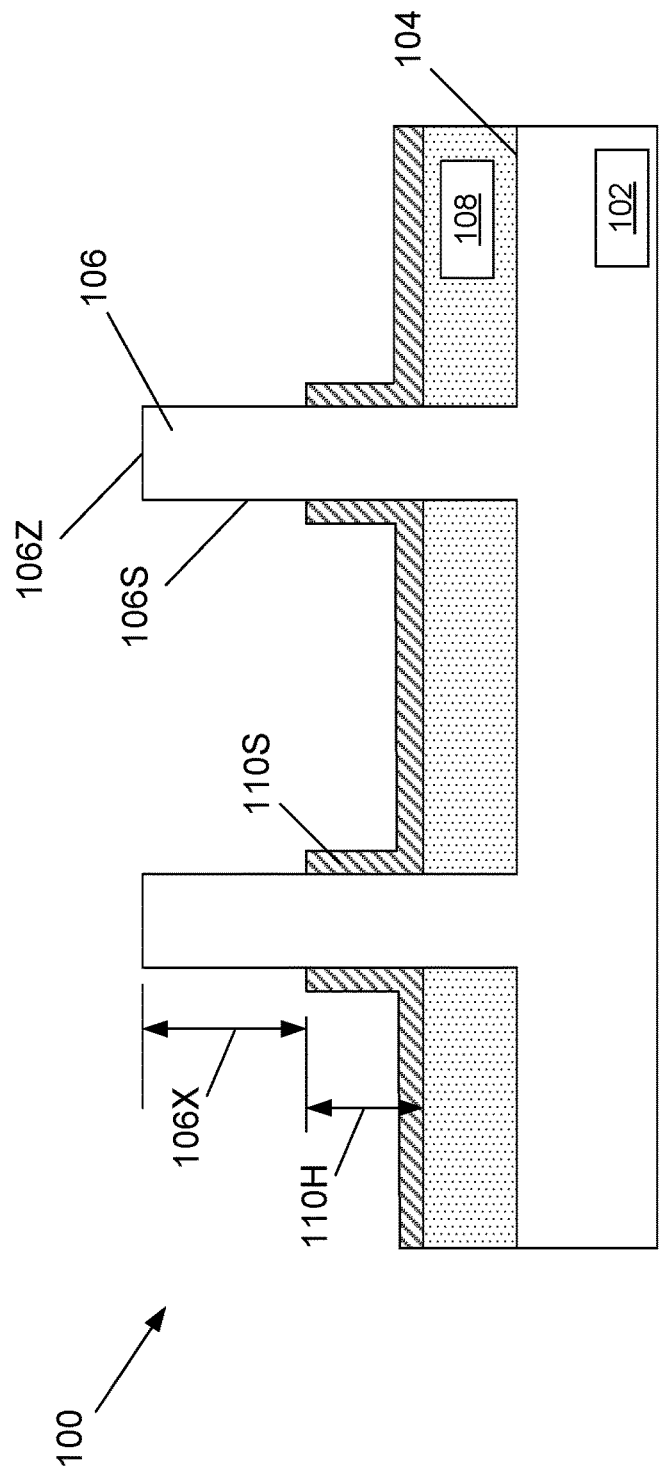
Figure 2K:
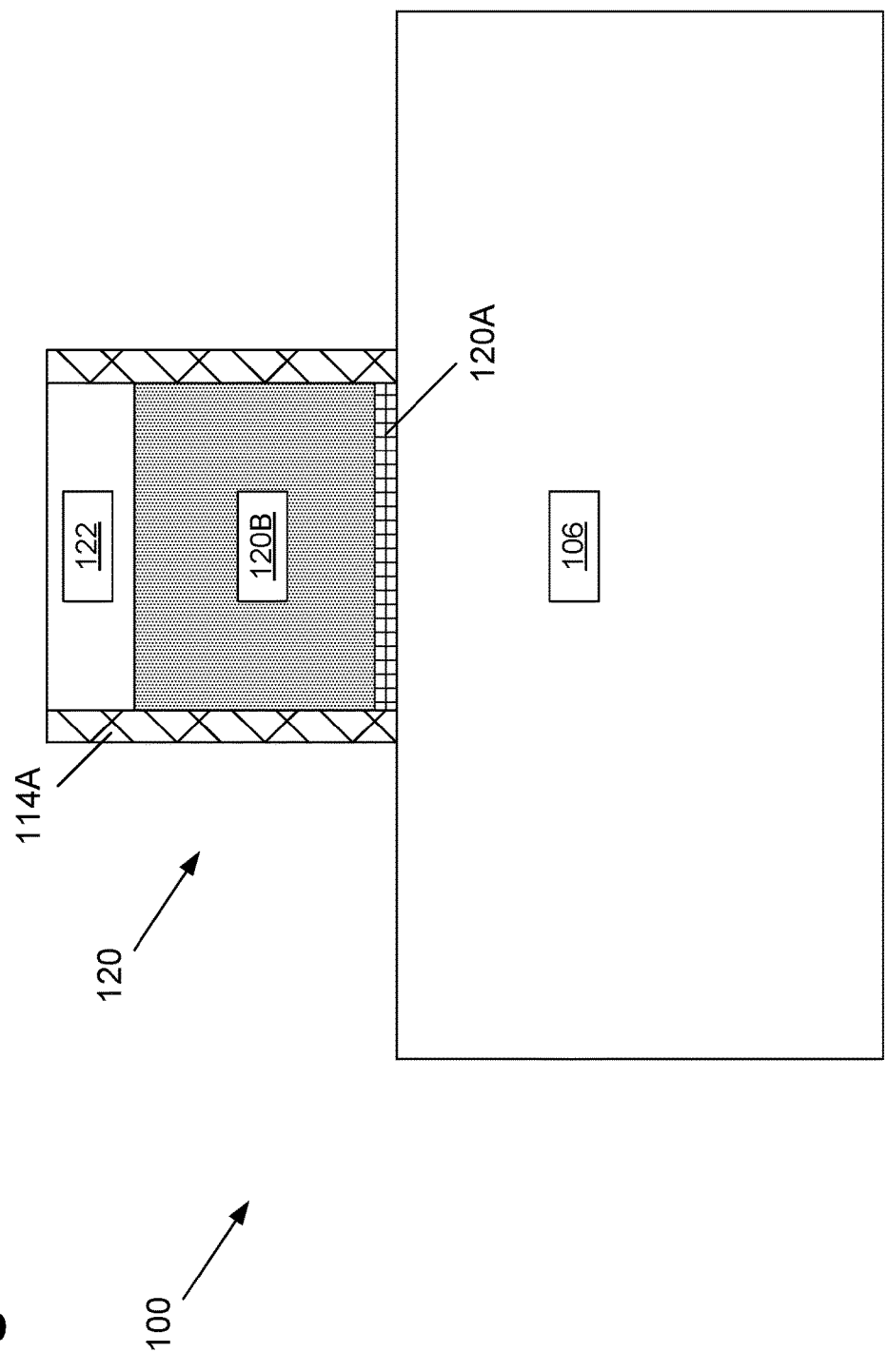

FIGS. 2J and 2K depict the product 100 after an anisotropic etching process was performed on the conformal layer of spacer material 114 to selectively remove the portions of the conformal layer of spacer material 114 relative to the surrounding materials including the conformal layer of fin spacer material 110. FIG. 2K is a cross-sectional view taken through the fin 106 in a direction corresponding to the gate length (current transport) direction of the device. As shown in FIGS. 2J and 2K, this etching process clears substantially all of the conformal layer of spacer material 114 from the fins 106 in the source/drain regions of the device above the first fin spacer 110S, thereby re-exposing the sidewalls 106S and upper surface 106Z of the fins 106. This etching process also results in the formation of a gate spacer 114A adjacent the gate structure 120. The formation of the gate spacer 114A can be accomplished by choosing the appropriate materials for the layers 110, 114 and using the appropriate etch chemistry.

Referring back to FIG. 2J, the removal of the conformal layer of spacer material 114 in the source/drain regions may result in some thinning of the thickness and/or tapering of the conformal layer of spacer material 110 (i.e., the fin spacer 110S) in the source/drain regions, but such thinning and/or tapering is not depicted in FIG. 2J. However, using the novel approach depicted herein, the resulting fin spacers 110S on the sidewalls of the fins 106 in the source/drain regions of the device have a substantially uniform height 110H that exposes a substantially uniform and desired amount 106X of the fins 106 across the entire substrate.

Figure 2L:
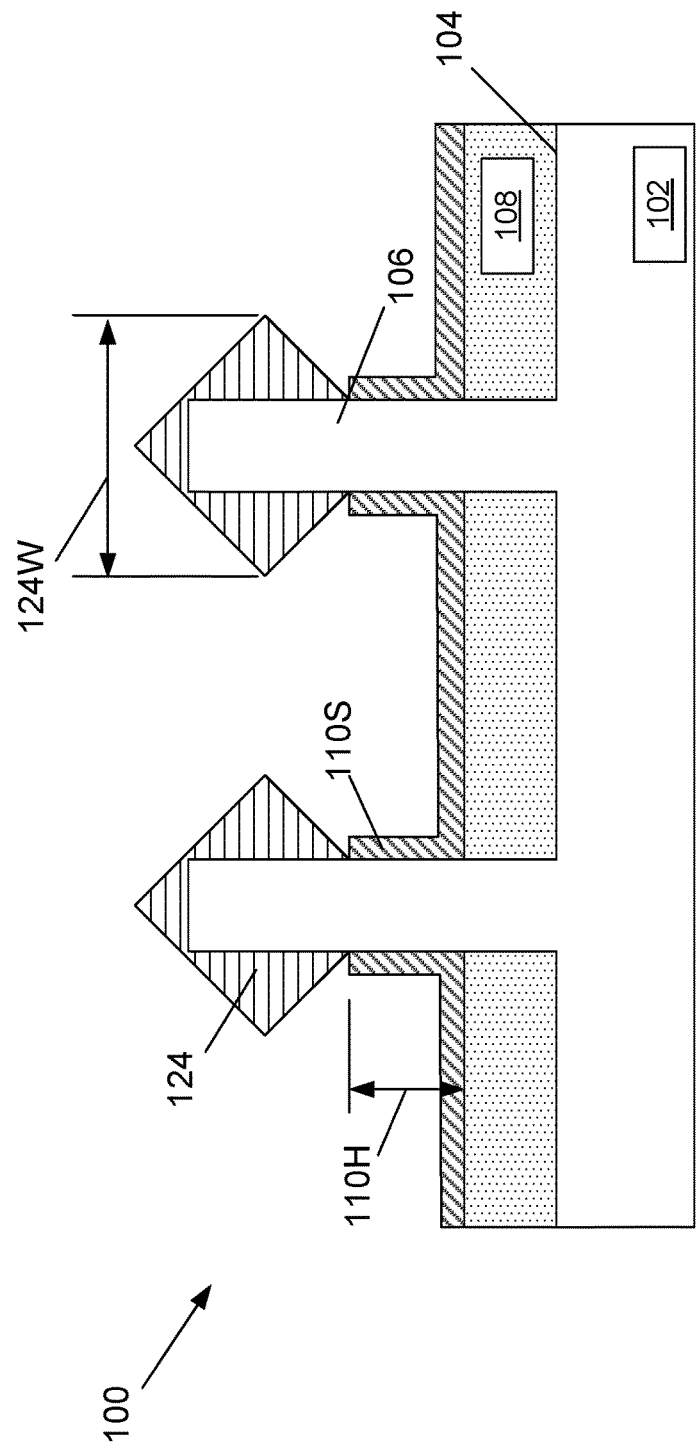

FIG. 2L depicts the product 100 after an epi deposition process was performed to form epi semiconductor material 124 on the exposed portions of the fins 106 in the source/drain regions of the device above the fin spacers 110S formed adjacent the sidewalls of the fins 106. The epi semiconductor material 124 may be any type of semiconductor material, and it may be a different material for N- and P-type devices. Note that, due to the substantially uniform height 110H of the fin spacers 110S in the source/drain regions, the epi semiconductor material 124 is substantially more uniform in terms of size on all of the fins 106. That is, using the method disclosed herein, the regions of epi semiconductor material 124 may have a substantially uniform width 124W (in the gate width direction of the device) as compared to prior art devices. Such uniformity in the size of the epi semiconductor material can lead to improved device performance and enable more accurate and reliable contacting of the epi semiconductor material 124 with conductive trench silicide structures (not shown).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming epi semiconductor material on a fin of a FinFET device, comprising:
    forming a fin spacer adjacent a lower portion of a fin above a recessed layer of insulating material, said fin spacer comprising a fin spacer material, wherein sidewalls of said fin located above an upper surface of said fin spacer and an upper surface of said fin are exposed;
    forming a conformal layer of a second spacer material on said exposed sidewalls and said upper surface of said fin, on said fin spacer and adjacent a gate structure of said FinFET device, wherein said second spacer material is a different material than said fin spacer material;
    performing an etching process to remove said conformal layer of said second spacer material from above said fin spacer and thereby re-expose said sidewalls of said fin located above said upper surface of said fin spacer and said upper surface of said fin and to form a gate spacer comprising said second spacer material adjacent said gate structure; and
    forming an epi semiconductor material on said exposed sidewalls and said upper surface of said fin above said fin spacer.

2. The method of claim 1, wherein forming said fin spacer adjacent said lower portion of said fin above said recessed layer of insulating material comprises:
    forming a first conformal layer of said fin spacer material on a portion of said fin positioned above said recessed layer of insulating material;
    forming a recessed layer of a sacrificial material above said recessed layer of insulating material, said recessed layer of insulating material having a recessed upper surface that is positioned at a level that is below said upper surface of said fin; and
    performing an etching process to remove a first portion of said first conformal layer of said fin spacer material located above said recessed upper surface of said recessed layer of sacrificial material so as to thereby expose said sidewalls and said upper surface of said fin while leaving a second portion of said first conformal layer of said fin spacer material positioned adjacent said sidewalls of said fin so as to thereby define said fin spacer.

3. The method of claim 2, wherein forming said recessed layer of said sacrificial material comprises:
    depositing a layer of said sacrificial material such that it has an as-deposited upper surface that is positioned above said upper surface of said fin;
    performing a planarization process on said as-deposited upper surface of said layer of said sacrificial material; and
    after performing said planarization process, performing a recess etching process on said layer of said sacrificial material so as to remove portions of said layer of said sacrificial material and thereby define said recessed layer of said sacrificial material with said recessed upper surface.

4. The method of claim 2, wherein said fin spacer material comprises one of silicon nitride, SiBCN, or SiOCN, said recessed layer of said sacrificial material comprises one of SOH or OPL, and said second conformal layer of said second spacer material comprises a low-k insulating material having a dielectric constant of less than about 4.3.

5. A method of forming epi semiconductor material on a fin of a FinFET device, comprising:
    forming a first conformal layer of a fin spacer material on a portion of a fin positioned above a recessed layer of insulating material;
    forming a recessed layer of a sacrificial material above said recessed layer of insulating material, said recessed layer of insulating material having a recessed upper surface that is positioned at a level that is below an upper surface of said fin;
    performing a first etching process to remove a first portion of said first conformal layer of said fin spacer material located above said recessed upper surface of said recessed layer of sacrificial material so as to thereby expose sidewalls and said upper surface of said fin while leaving a second portion of said first conformal layer of said fin spacer material positioned adjacent said sidewalls of said fin;
    performing a second etching process to remove said recessed layer of said sacrificial material selectively relative to said second portion of said first conformal layer of said fin spacer material;
    forming a second conformal layer of a second spacer material on said exposed sidewalls and said upper surface of said fin, on said second portion of said first conformal layer of said fin spacer material and adjacent a gate structure of said FinFET device, wherein said second spacer material is a different material than said fin spacer material;
    performing a third etching process to remove said second conformal layer of said second spacer material from above said second portion of said first conformal layer of said fin spacer material; and
    forming an epi semiconductor material on said exposed sidewalls and said upper surface of said fins above said second portion of said first conformal layer of said fin spacer material.

6. The method of claim 5, wherein said fin spacer material comprises one of silicon nitride, SiBCN, or SiOCN, said recessed layer of said sacrificial material comprises one of SOH or OPL, and said second conformal layer of said second spacer material comprises a low-k insulating material having a dielectric constant of less than about 4.3.

7. The method of claim 5, wherein forming said recessed layer of said sacrificial material comprises:
    depositing a layer of said sacrificial material such that it has an as-deposited upper surface that is positioned above said upper surface of said fin;

performing a planarization process on said as-deposited upper surface of said layer of said sacrificial material; and after performing said planarization process, performing a recess etching process on said layer of said sacrificial material so as to remove portions of said layer of said sacrificial material and thereby define said recessed layer of said sacrificial material with said recessed upper surface.

8. The method of claim 5, wherein performing said first etching process also removes portions of said fin spacer material formed adjacent a gate structure of said FinFET device.

9. The method of claim 5, wherein performing said third etching process also results in the formation of a gate spacer comprised of said second spacer material adjacent said gate structure.

10. A method of forming epi semiconductor material on a fin of a FinFET device, comprising:

forming a first conformal layer of a fin spacer material on a portion of a fin positioned above a recessed layer of insulating material;

forming a recessed layer of a sacrificial material above said recessed layer of insulating material, said recessed layer of insulating material having a recessed upper surface that is positioned at a level that is below an upper surface of said fin;

performing a first etching process to remove a first portion of said first conformal layer of said fin spacer material located above said recessed upper surface of said recessed layer of said sacrificial material so as to thereby expose sidewalls and said upper surface of said fin while leaving a second portion of said first conformal layer of said fin spacer material positioned adjacent said sidewalls of said fin, at least a portion of said second portion of said first conformal layer of said fin spacer material defining a fin spacer;

performing a second etching process to remove said recessed layer of said sacrificial material selectively relative to said fin spacer;

forming a second conformal layer of a second spacer material on said exposed sidewalls and said upper surface of said fin, on said fin spacer and on a gate structure of said FinFET device, wherein said second spacer material is a different material than said fin spacer material;

performing a third etching process to remove said second conformal layer of said second spacer material from above said fin spacer so as to thereby re-expose said sidewalls of said fin located above an upper surface of said first fin spacer and said upper surface of said fin while forming a gate spacer comprising said second spacer material adjacent said gate structure; and forming an epi semiconductor material on said exposed sidewalls and said upper surface of said fin above said fin spacer.

11. The method of claim 10, wherein said fin spacer material comprises one of silicon nitride, SiBCN, or SiOCN, said recessed layer of said sacrificial material comprises one of SOH or OPL, and said second conformal layer of said second spacer material comprises a low-k insulating material having a dielectric constant of less than about 4.3.

12. The method of claim 11, wherein forming said recessed layer of said sacrificial material comprising:

depositing a layer of said sacrificial material such that it has an as-deposited upper surface that is positioned above said upper surface of said fin;

performing a planarization process on said as-deposited upper surface of said layer of said sacrificial material; and after performing said planarization process, performing a recess etching process to said layer of said sacrificial material so as to remove portions of said layer of said sacrificial material and thereby define said recessed layer of said sacrificial material with said recessed upper surface.

* * * * *